(12) United States Patent
Hyde et al.

(10) Patent No.: US 9,561,603 B2
(45) Date of Patent: *Feb. 7, 2017

(54) NANOIMPRINT LITHOGRAPHY

(71) Applicant: Elwha LLC, Bellevue, WA (US)

(72) Inventors: Roderick A. Hyde, Redmond, WA (US); Jordin T. Kare, Seattle, WA (US); Thomas A. Weaver, San Mateo, CA (US)

(73) Assignee: ELWHA, LLC, Bellevue, WA (US)

( * ) Notice: Subject to any disclaimer, the term of this patent is extended or adjusted under 35 U.S.C. 154(b) by 508 days.

This patent is subject to a terminal disclaimer.

(21) Appl. No.: 13/733,721

(22) Filed: Jan. 3, 2013

(65) Prior Publication Data

US 2014/0183795 A1 Jul. 3, 2014

(51) Int. Cl.
*B29C 33/42* (2006.01)
*B29C 59/02* (2006.01)
(Continued)

(52) U.S. Cl.
CPC .......... *B29C 33/424* (2013.01); *B29C 59/022* (2013.01); *G03F 7/0002* (2013.01);
(Continued)

(58) Field of Classification Search
CPC .......... B29C 33/38; B29C 33/10; B29C 33/02; B29C 59/00; B29C 59/16; B82Y 40/00; G03F 7/00; G03F 7/0002
(Continued)

(56) References Cited

U.S. PATENT DOCUMENTS

| 5,772,905 A | 6/1998 | Chou |
| 7,378,028 B2 | 5/2008 | Wago et al. |

(Continued)

FOREIGN PATENT DOCUMENTS

| DE | 10 2010 026 490 A1 | 1/2012 |
| JP | 2009202443 A * | 9/2009 |

(Continued)

OTHER PUBLICATIONS

JP 2009202443 A. Machine Translation.*
(Continued)

*Primary Examiner* — Matthew Daniels
*Assistant Examiner* — Leith S Shafi

(57) ABSTRACT

A mold may include a plurality of nanostructures configured to form a lithographic pattern when imprinted into a material. Imprinting may include imprinting the mold a first predetermined distance, modifying a temperature of the material, and altering a position of the mold based on the temperature modification. One or more thermal elements may alter a temperature of a first section of the material and/or one or more nanostructures for a predetermined pulse time less than an equilibrium time required for the mold and/or material to reach a stable temperature state. A first thermal element may selectively alter the temperature of a first section of the material and/or a first nanostructure and a second thermal element may selectively alter the temperature of a second section of the material and/or a second nanostructure. The one or more thermal elements may include one or more thermoelectric elements.

38 Claims, 13 Drawing Sheets

(51) Int. Cl.
*G03F 7/00* (2006.01)
*B29C 35/08* (2006.01)
*B29C 35/16* (2006.01)

(52) U.S. Cl.
CPC .. *B29C 35/0888* (2013.01); *B29C 2035/0827* (2013.01); *B29C 2035/0844* (2013.01); *B29C 2035/1616* (2013.01); *B29C 2059/023* (2013.01)

(58) Field of Classification Search
USPC ........ 264/446, 494, 496, 293; 425/383, 385, 425/407
See application file for complete search history.

(56) References Cited

U.S. PATENT DOCUMENTS

| | | | |
|---|---|---|---|
| 7,771,790 | B2 | 8/2010 | Faguet |
| 8,247,033 | B2 | 8/2012 | Russell et al. |
| 8,268,461 | B1 | 9/2012 | Hellwig et al. |
| 8,293,125 | B2 | 10/2012 | Imada et al. |
| 2004/0036201 | A1 | 2/2004 | Chou et al. |
| 2006/0279022 | A1 | 12/2006 | Seki et al. |
| 2008/0057192 | A1 | 3/2008 | Faguet |
| 2009/0266418 | A1 | 10/2009 | Hu et al. |
| 2010/0072665 | A1* | 3/2010 | Imai et al. ............... 264/293 |
| 2010/0078840 | A1 | 4/2010 | Kawakami et al. |
| 2010/0105206 | A1 | 4/2010 | Maekawa |
| 2010/0166906 | A1 | 7/2010 | Hashimoto et al. |
| 2010/0173167 | A1 | 7/2010 | Vissing et al. |
| 2010/0308008 | A1 | 12/2010 | Zhu et al. |
| 2011/0062634 | A1* | 3/2011 | Landis et al. ............... 264/404 |
| 2011/0129956 | A1 | 6/2011 | Polito et al. |
| 2012/0021250 | A1 | 1/2012 | Lee et al. |
| 2012/0112387 | A1 | 5/2012 | Landis et al. |
| 2012/0292820 | A1* | 11/2012 | Smistrup et al. ............... 264/293 |
| 2012/0299175 | A1 | 11/2012 | Tran |
| 2013/0101796 | A1 | 4/2013 | Arzt et al. |
| 2013/0128246 | A1* | 5/2013 | Koevoets et al. ............... 355/53 |
| 2014/0183773 | A1 | 7/2014 | Hyde et al. |
| 2014/0183795 | A1 | 7/2014 | Hyde et al. |

FOREIGN PATENT DOCUMENTS

| | | |
|---|---|---|
| WO | WO 2011/050817 A1 | 5/2011 |
| WO | WO 2012/019874 A1 | 2/2012 |

OTHER PUBLICATIONS

U.S. Appl. No. 13/733,752 Claims filed Jan. 15, 2014.*
PCT International Search Report; International App. No. PCT/US14/10092; Apr. 23, 2014; pp. 1-2.
Lazaridis, Giorgos; "The Peltier Thermo-Element—Electronic Theory"; PCB Heaven Tech news Blog; bearing a date of Jun. 13, 2009; pp. 1-7; located at: http://web.archive.org/web/20101128030142/http://pcbheaven.com/wikipages/The_Peltier_Thermo-Element/.
"Frequently Asked Questions About Our Cooling and Heating Technology" located at https://web.archive.org/web/20100427014602/http://www.tellurex.com/technology/peltier-faq.php; Apr. 2010; pp. 1-14; Tellurex.

* cited by examiner

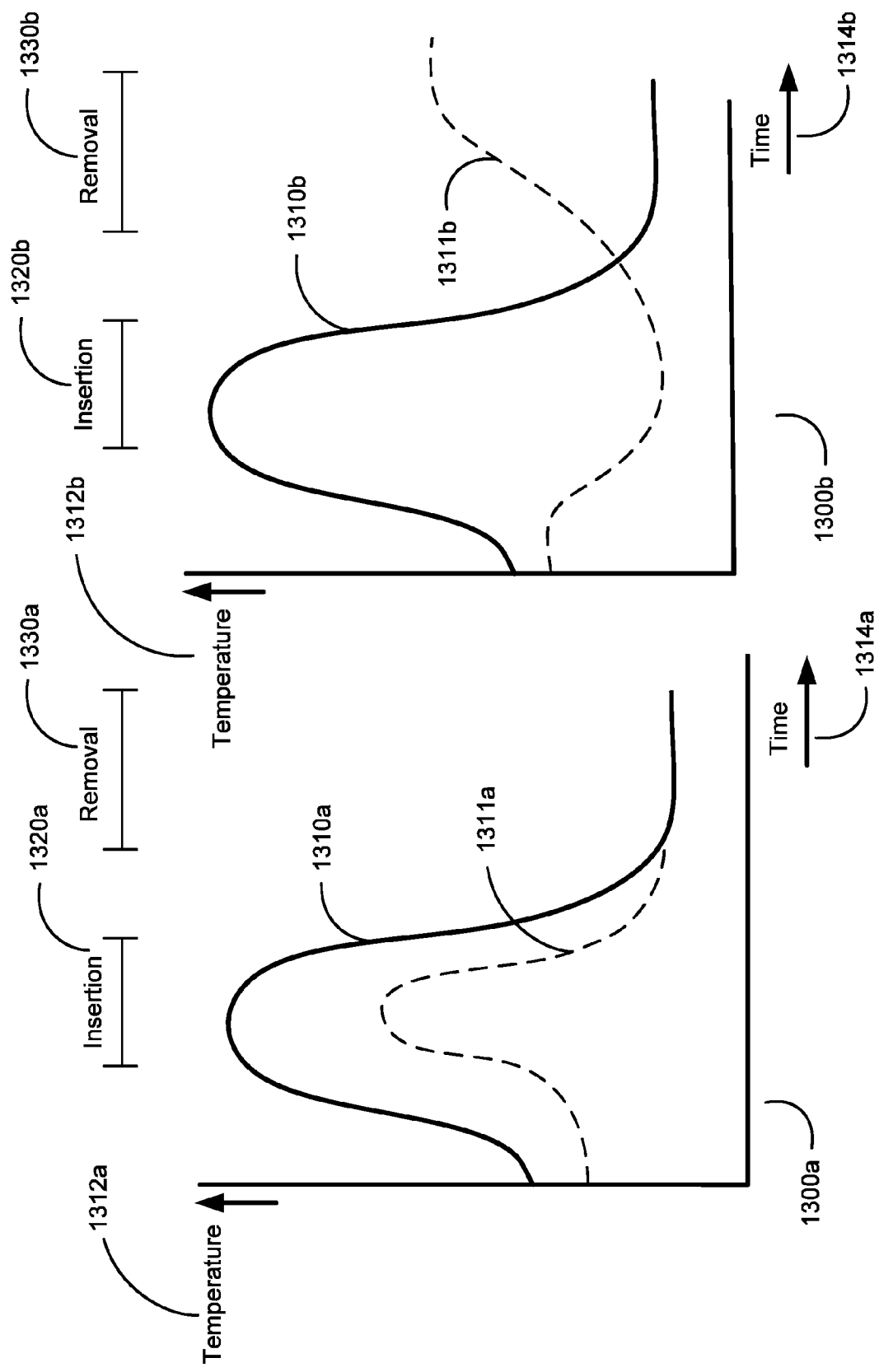

NANOIMPRINT LITHOGRAPHY

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

None

RELATED APPLICATIONS

U.S. patent application Ser. No. 13/733,752, entitled NANOIMPRINT LITHOGRAPHY, naming Roderick A. Hyde, Jordin T. Kare, and Thomas A. Weaver as inventors, filed 3 Jan. 2013, is related to the present application.

U.S. patent application Ser. No. 13/733,765, entitled NANOIMPRINT LITHOGRAPHY, naming Roderick A. Hyde, Jordin T. Kare, and Thomas A. Weaver as inventors, filed 3 Jan. 2013, is related to the present application.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, *Benefit of Prior-Filed Application*, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

This application relates to systems and methods for nanoimprinting a lithographic pattern.

SUMMARY

A lithographic pattern may be formed on a material, such as a resist, by imprinting a mold with a plurality of nanostructures into the material. Imprinting may include imprinting the mold a first predetermined distance, modifying a temperature of the material after imprinting the first predetermined distance, and adjusting a position of the mold after modifying the temperature of the material. The mold may be withdrawn and any residual resist can be removed. The desired processing can then be performed on the exposed substrate.

A temperature of the mold and/or material may be modified using temporally and/or spatially localized temperature control. Temporally localized temperature control may include modifying a temperature of one or more nanostructures and/or a section of the mold and/or material for a predetermined pulse time. The predetermined pulse time may be less than an equilibrium time required for the mold and/or material to reach thermal equilibrium. At thermal equilibrium, the mold and/or material may be in a stable temperature state.

Spatially localized control may include using multiple thermal elements to selectively modify the temperature of corresponding nanostructures and/or sections of the mold and/or material. The thermal elements may include one or more thermoelectric elements. Thermoelectric elements may be configured to deliver and/or remove heat based on the polarity of the voltage applied to them. The thermoelectric elements may also be used to deliver thermal pulses, such as delivering heat with a first thermal pulse and removing heat with a second thermal pulse.

BRIEF DESCRIPTION OF THE DRAWINGS

FIG. 13A is a graph of temperature curves for the thermoelectric elements.

FIG. 13B is a graph of temperature curves for the thermoelectric elements.

DETAILED DESCRIPTION OF PREFERRED EMBODIMENTS

Figure 1:
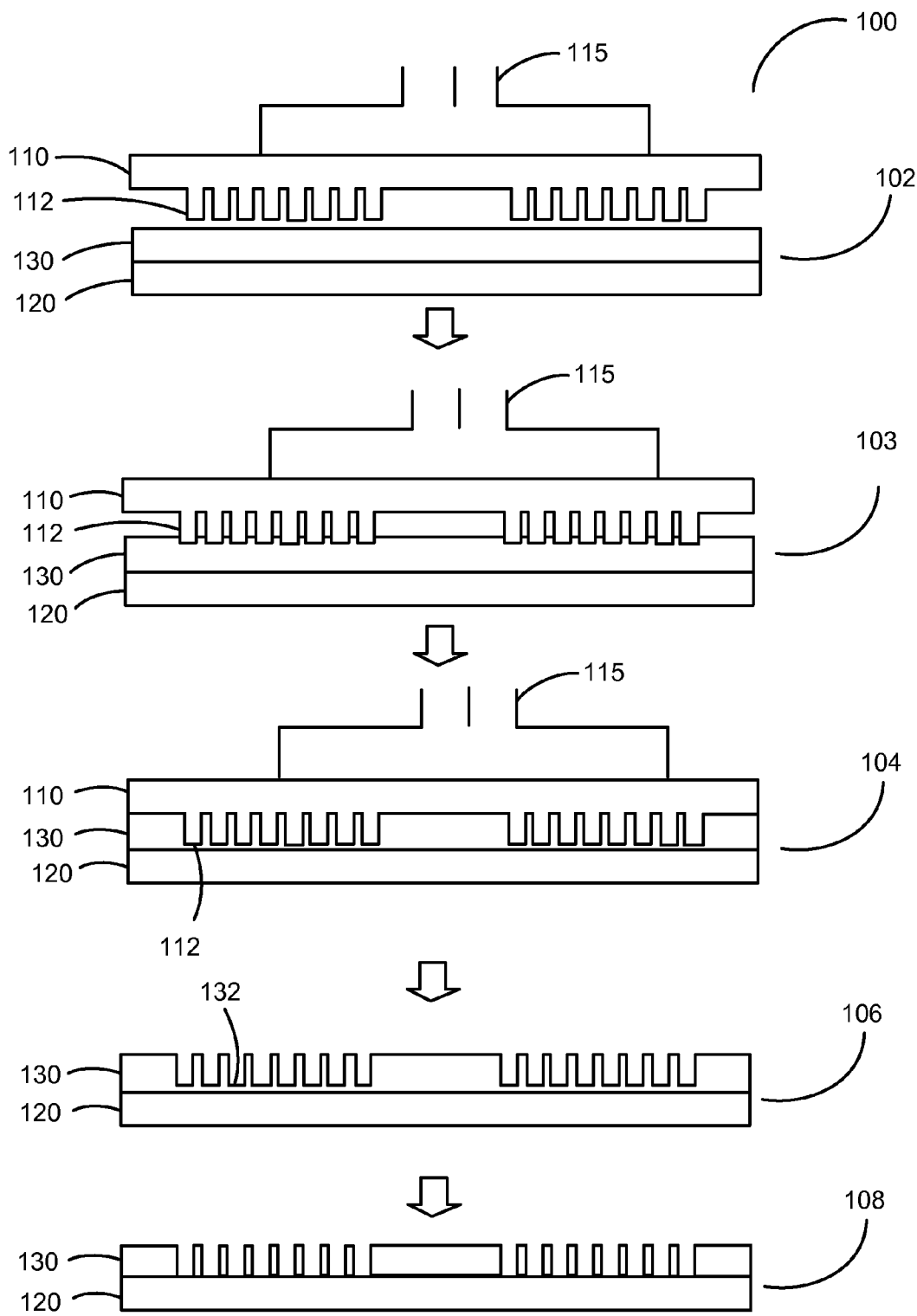
FIG. 1 is cross-section view of steps in a method for imprinting a lithographic pattern.

Nanoimprint lithography includes various methods for producing a lithographic pattern in a material. A mold may be formed that produces the lithographic pattern when the mold is imprinted into the material. The mold may include a plurality of nanostructures that produce features with sizes on the order of nanometers or smaller when imprinted into the material. For example, the mold may be imprinted into a resist and/or mask. The resist and/or mask may be a liquid, a solid above a glass transition temperature, or the like. Once the mold has been imprinted, the resist and/or mask may be cured with ultraviolet (UV) light and/or cooled below the glass transition temperature. After the mold is removed, a thin layer of residual resist and/or mask material may remain where the pattern has been imprinted. This residual resist and/or mask material may be removed by known etching techniques. Deposition and/or etching may then be performed on exposed portions of the substrate. The mold may be configured to pattern one or more transistor elements, elements of an information storage device, elements of a photonic device, components of an electromechanical system, and/or the like. Multiple elements and/or components may be combined to create a transistor, information storage device, photonic device, electromechanical system, or the like.

Imprinting the mold into the resist may include multiple steps. The mold may be imprinted a first predetermined distance into the material using an imprinting mechanism. During imprinting and/or after the mold is imprinted the first predetermined distance, a temperature of the material may be modified, such as with a thermal element. For example, the thermal element may begin modifying the temperature while the mold is being imprinted the first distance. After the temperature has been modified, a position of the mold may be adjusted based on the temperature modification. In an embodiment, imprinting a first predetermined distance may include touching the surface of the material with the mold (e.g., the first predetermined distance may be substantially zero). In another embodiment, the first predetermined distance substantially equals a material depth. In another embodiment, the first predetermined distance corresponds to a modified temperature depth (e.g., the depth of material that has had its temperature modified).

Adjusting a position may include imprinting the mold a second predetermined distance, rotating the mold and/or at least one nanostructure to create an undercut in the material, withdrawing the mold fully or partially from the material, and/or the like. The second predetermined distance may correspond to the modified temperature depth. The sum of the first predetermined distance and the second predetermined distance may be less than the first predetermined distance. The sum of the first predetermined distance and the second predetermined distance may substantially equal the material depth. The sum of the first predetermined distance and the second predetermined distance may substantially equal and/or correspond to the modified temperature depth. Adjusting a position based on the temperature modification may include adjusting the position based on a predicted spatial temperature profile, based on a predicted spatial-temporal temperature profile, based on measurements from a sensor, and/or the like. The sensor measurements may be used to determine a velocity and/or imprint force to use when adjusting the position.

The temperature of the material may be further altered after the position of the mold has been adjusted. The thermal element may begin further altering the temperature during adjusting of the position (e.g., while the mold is being imprinted the second predetermined distance.) The thermal element may deliver heat when initially modifying the temperature and remove heat during the further alteration of the temperature. After the heat has been removed, the mold may be withdrawn from the material. The thermal element may be configured to deliver a first predetermined amount of heat when initially modifying the temperature and deliver a second predetermined amount of heat during the further alteration of the temperature. A property of the material may be modified during the initial temperature modification and/or during the further alteration of the material.

Temperature control for nanoimprint lithography may be localized spatially and/or temporally. In an embodiment, the temperature of spatially localized areas of the material into which the mold is being imprinted may be altered. For example, one or more thermal elements may be configured to alter the temperature of a section of the material smaller than the whole material. Alternatively or in addition, the temperature of specific nanostructures on the mold and/or a section of the mold smaller than the whole mold may be altered by the one or more thermal elements.

To achieve temporally localized temperature control, the temperature of the material and/or mold, such as the temperature of specific nanostructures and/or sections, may be altered for a predetermined pulse time using the thermal element. Thermal diffusion may result in the material and/or mold reaching thermal equilibrium (i.e., a stable temperature state) if the pulse time is long enough. Accordingly, the predetermined pulse time may be selected to be less than an equilibrium time required for the material and/or mold to reach thermal equilibrium. A spatial temperature profile may be created in the section of the material and/or mold based on the predetermined pulse time. A spatial profile of material at a same temperature may be created based on the predetermined pulse time. Accordingly, the pulse time may be selected to create a predetermined spatial temperature profile in the material and/or mold and/or to create a predetermined spatial profile of material at an operative temperature.

The pulse time may be selected to be less than an imprint time, selected based on a thermal diffusivity of the material and/or mold, and/or the like. The thermal element may be configured to alter the temperature of the material and/or mold a plurality of times for a corresponding plurality of predetermined pulse times. The thermal element may deliver a sequence of thermal pulses that deliver heat to or remove heat from the material and/or mold with each thermal pulse lasting for a corresponding predetermined pulse time. For example, the thermal element may deliver heat for a predetermined heating time and remove heat for a predetermined cooling time. The thermal element may be configured to remove heat during separation of the mold from the material. The thermal element may be configured to deliver and/or remove a predetermined amount of heat from the material and/or mold.

The thermal element may be positioned in a variety of locations. The thermal element may be in direct contact with the substrate, or the thermal element may be in one of the plurality of nanostructures. The thermal element may be thermally coupled to one or more of the plurality of nanostructures. The thermal element may modify the temperature of the material by modifying a temperature of one of the plurality of nanostructures. One or more of the plurality of nanostructures may conduct thermal energy between the thermal element and the section of the material and/or mold. When the thermal element is configured to alter the temperature of a section of the material, one or more nanostructures may be configured to imprint in that section and/or within a predetermined diffusion distance of that section.

Multiple sections of the material and/or mold may have their temperature altered by thermal elements. For example, a first thermal element may alter a first temperature of a first nanostructure and/or a first section of the material and/or mold, and a second thermal element may alter a second temperature of a second nanostructure and/or a second section of the material and/or mold. The thermal elements may be configured and/or positioned to create a predetermined spatial temperature profile in the material and/or mold and/or a predetermined spatial profile of material at an operative temperature. Under one configuration, the first thermal element may deliver heat to the first section and/or nanostructure, and the second thermal element may remove heat from the second section and/or nanostructure. In another configuration, the first thermal element may deliver a first predetermined amount of heat to the first section and/or nanostructure, and the second thermal element may deliver a second predetermined amount of heat to the second section and/or nanostructure.

Various thermal elements may be used to alter the temperature of the material and/or mold. A photoirradiation unit may include one or more thermal elements. The photoirradiation unit may be configured to generate a first pixel of radiation on the first section of the material and/or mold and a second pixel of radiation on the second section of the material and/or mold. The mold may include a first portion with a first transparency and a second portion with a second transparency to generate the first and second pixels. A cooling element may cool the material and/or mold while the first and second pixels are generated on the material and/or mold. The mold may be substantially and/or entirely transparent to radiation from the photoirradiation unit.

The thermal element may include a heating element, such as a resistive heating element, a photoheating element, and/or the like. The photoheating element may be configured to emit UV light, x-rays, and/or the like. The mold may be substantially or entirely transparent to the radiation from the photoheating element. A cooling element may be configured to cool the material and/or mold while the heating element heats the first nanostructure and/or the first section of the material and/or mold. The thermal element may include a cooling element. The cooling element may include a thermally conductive fluid, such as water. The cooling element may include a heat sink. The heat sink may be configured to change phase, such as by melting and/or vaporizing. A heating element may be configured to heat the material and/or mold while the cooling element removes heat from the first nanostructure and/or the first section of the material and/or mold. Heating elements and cooling elements may be separated from one another by thermal insulation.

The thermal element may include a thermoelectric element. A thermoelectric element may be configured to deliver heat to the first nanostructure and/or the first section when a voltage with a first polarity is applied and may be configured to remove heat from the first nanostructure and/or the first section when a voltage with a second polarity is applied. The thermoelectric element may heat the first nanostructure and/or the first section for a first time period and cool the first nanostructure and/or the first section for a second time period. The thermoelectric element and a heating and/or cooling element may be configured to alter the temperature of the material and/or mold. The thermoelectric element may be configured to alter a first temperature of the first nanostructure and/or the first section of the material and/or mold and the heating and/or cooling element may be configured to alter a temperature of the remainder of the material and/or mold and/or the other of the material and the mold. A first thermoelectric element may be configured to alter the first temperature of the first nanostructure and/or the first section, and a second thermoelectric element may be configured to alter a material temperature of the material and/or a second temperature of the second nanostructure and/or the second section. Thermoelectric elements may be separated from each other, from heating elements, and/or from cooling elements by thermal insulation.

The thermoelectric element may be made from doped semiconductors. A first doped semiconductor may include excess electron holes, and a second doped semiconductor may include excess electrons. First and second conductors may couple the first and second doped semiconductors respectively to a selectively operable power source. The selectively operable power source may be configured to selectively apply the first or second polarity to the thermoelectric element depending on whether heat should be delivered or removed. A third conductor may couple the first doped semiconductor to the second doped semiconductor. The first and second conductors and/or the third conductor may be configured to deliver and remove the heat from the material and/or mold.

One or more sensors may be configured to acquire time dependent measurements of properties of the material and/or mold. Sensors may measure the temperature of the material and/or mold, an optical property of the material and/or mold, an electrical property of the material and/or mold, and/or the like. The predetermined pulse time may be selected based on the time dependent measurements. The first and/or second thermal element may be configured to selectively alter the first and/or second temperature based on feedback from the sensor and/or based on the time dependent measurements. When to start and/or stop imprinting and/or removing the mold may be determined based on the time dependent measurements.

When imprinting the mold into the material, the imprint depth may equal the depth of the material. Alternatively, the imprint depth may substantially equal the depth of the material. For example, the imprint depth may be selected to leave a thin layer of material where the pattern has been imprinted. To create a desired spatial temperature profile, the material may include a first substance with a first thermal diffusivity and a second substance with a second thermal diffusivity. A single thermal element may alter the temperature of the first and second substances, and/or each substance may have a corresponding thermal element configured to alter a temperature of that substance. A first of the plurality of nanostructures may be configured to imprint in the first substance, and a second of the plurality of nanostructures may be configured to imprint in the second substance.

The mold may imprint into various materials. The mold may imprint into a resist. The resist may include a mask, a monomer, a polymer, such as a thermoplastic polymer, a liquid curable under UV light, and/or the like. The mold may imprint into the substrate. The substrate may include silicon, silicon dioxide, and/or the like. The thermal element may be configured to modify a property of the substrate. The thermal element may modify a chemical property, such as by causing decomposition of a substrate element, by causing a reaction between two elements on the substrate, by cross-linking two elements on the substrate, and/or the like. The thermal element may modify a physical property, such as by changing a viscosity of the substrate, changing a strength of the substrate, changing a phase of the substrate, and/or the like.

FIG. 1 is cross-section view of steps 102, 103, 104, 106, 108 in a method 100 for imprinting a lithographic pattern. First, a mold 110 including a plurality of nanostructures 112 configured to create the lithographic pattern and a substrate 120 with a layer of resist 130 may be provided 102. The resist 130 may be an UV curable liquid and/or a material above its glass-transition temperature. The resist 130 may be heated above its glass-transition temperature during step 102. The mold 110 may be attached to an imprinting mechanism 115. The imprinting mechanism 115 may imprint 103 the mold 110 a first predetermined distance into the resist 130. After or during imprinting 103, the resist 130 may be further heated and/or cooled. In some embodiments, step 103 may be omitted.

The imprinting mechanism 115 may imprint 104 the mold 110 a second predetermined distance into the resist 130. After or during imprinting 104 the second predetermined distance, the resist 130 may be UV cured and/or cooled below its glass-transition temperature. Alternatively or in addition, the temperature of the resist 130 and/or the substrate 120 may be altered to modify a chemical and/or physical property of the resist 130 and/or the substrate 120. Next, the mold 110 may be removed 106 from the resist 130. A thin layer of resist 132 may remain where the pattern was imprinted. Etching 108 may remove the thin layer of resist 132 leaving the substrate 120 exposed for the desired processing.

Figure 2:
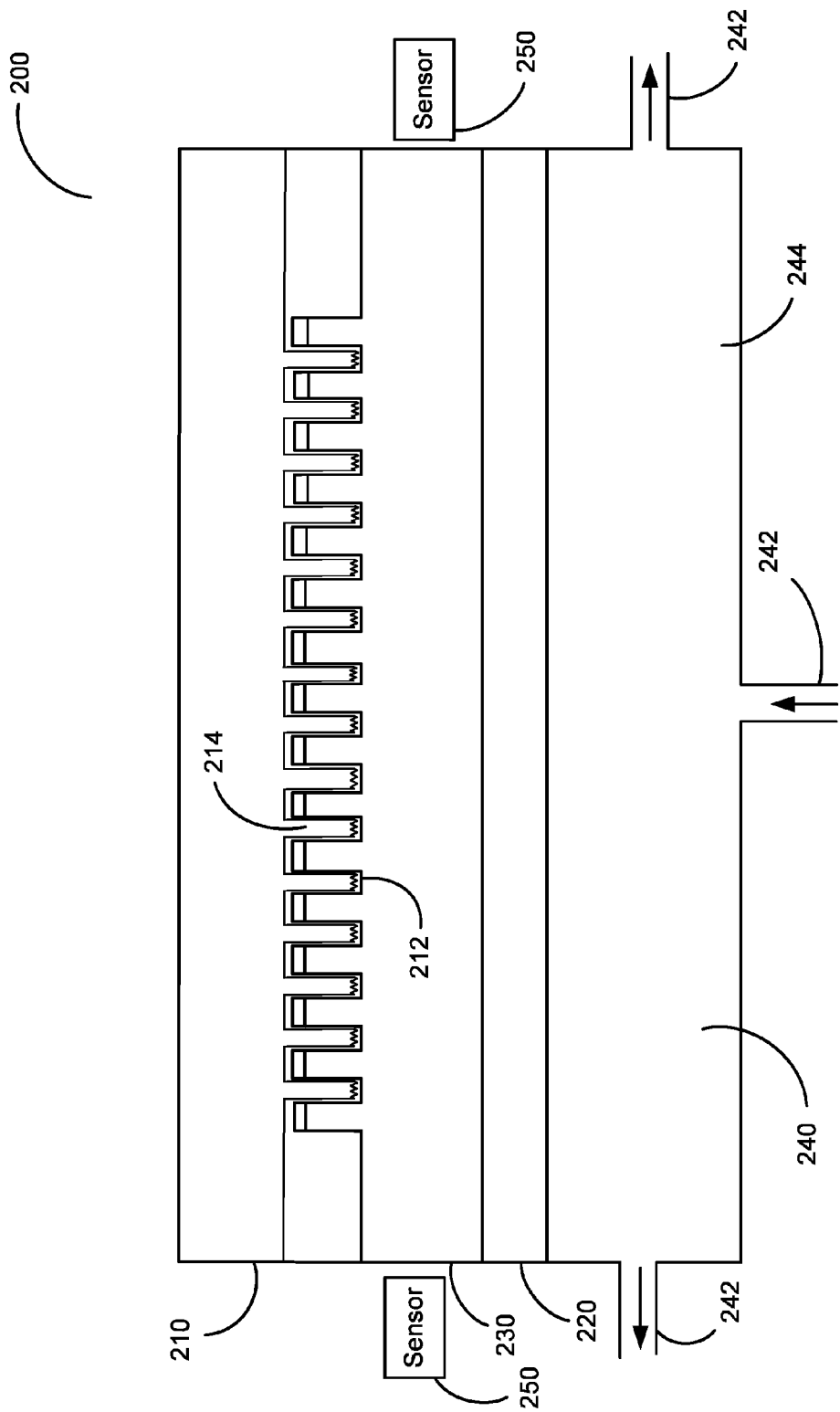
FIG. 2 is a cross-section view of a system for nanoimprinting a lithographic pattern into a resist.

FIG. 2 is a cross-section view of a system 200 for nanoimprinting a lithographic pattern into a resist 230. A mold 210 may include a plurality of nanostructures 212 and a plurality of heating elements 214 configured to heat the plurality of nanostructures 212. The plurality of heating elements 214 may include a plurality of resistive heating elements. A cooling element 240 may be in thermal contact with a substrate 220. The cooling element 240 may include a plurality of ports 242 to circulate thermally conductive fluid 244 and thereby to remove heat from the substrate 220. The thermally conductive fluid 244 may be circulated to a heat sink (not shown) or the like to remove excess heat from the thermally conductive fluid 244. A plurality of temperature sensors 250 may detect the temperature of the resist 230. The positions of the heating elements 214 and cooling element 240 as well as the amount of heat delivered and removed by those elements may be selected to create a predetermined spatial temperature profile in the resist 230.

Figure 3:
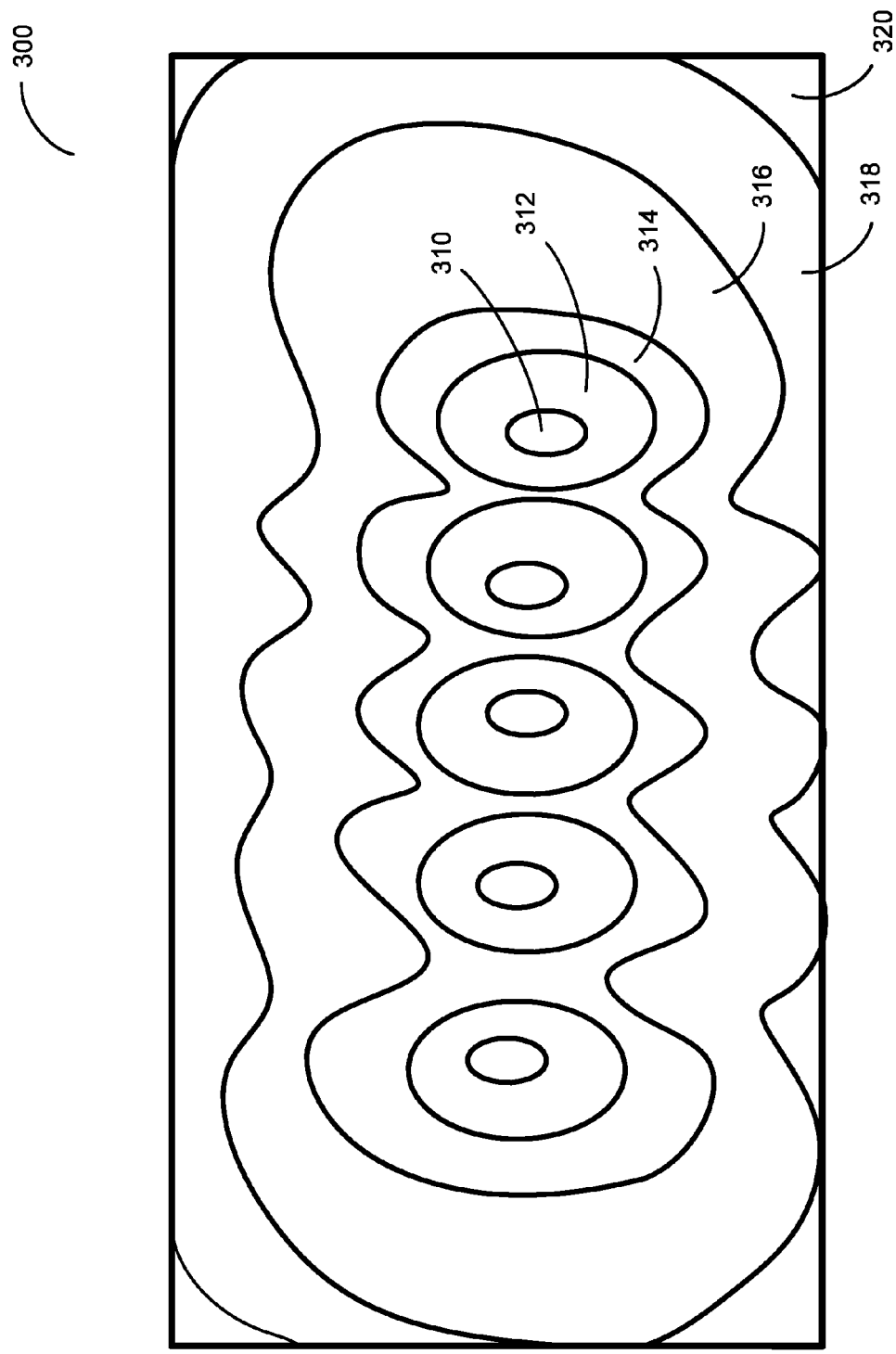
FIG. 3 is a top perspective view of a spatial temperature profile that may be created by a nanoimprint system.

FIG. 3 is a top perspective view of a spatial temperature profile 300 that may be created by a nanoimprint system similar to the nanoimprint system 200. The spatial temperature profile may include a plurality of regions 310, 312, 314, 316, 318, 320, each at a same temperature. The region 310 in contact with the nanostructures 212 may be at a hottest temperature and therefore most deformable. The region 320 furthest from the nanostructures 212 may be at a coldest temperature and therefore least deformable. Accordingly, the mold 210 may leave a pattern in the region 310 in contact with the nanostructures 212 without unduly damaging and/or deforming the region 320 furthest from the nanostructures 212.

Figure 4:
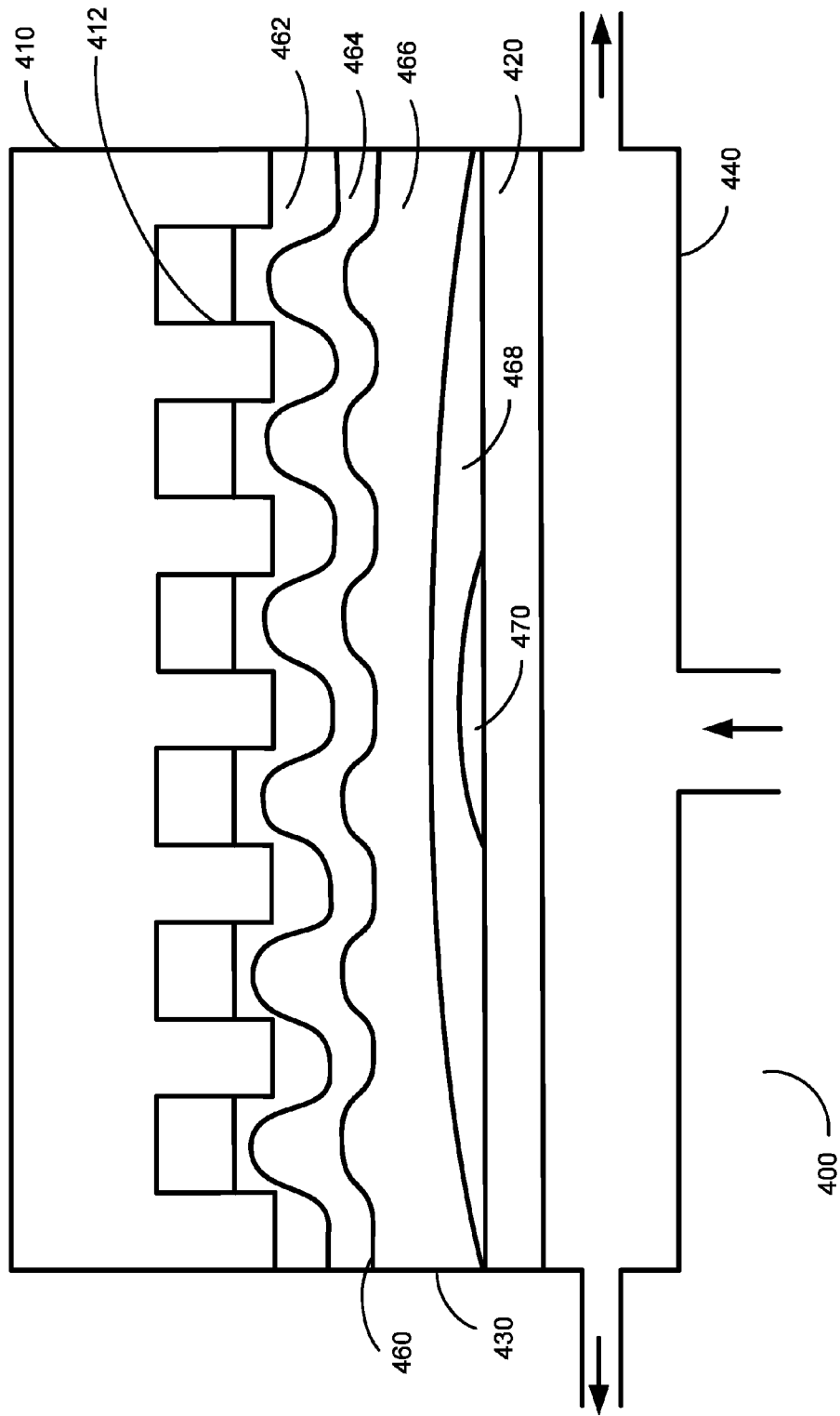
FIG. 4 is a cross-section view of a system and a spatial temperature profile created in a resist by that system.

FIG. 4 is a cross-section view of a system 400 and a spatial temperature profile 460 created in a resist 430 by that system 400. The spatial temperature profile 460 includes a plurality of regions 462, 464, 466, 468, 470, each at a same temperature. A mold 410 may include heated nanostructures 412 that conduct heat to the resist 430. A hottest region 462 may be in contact with the nanostructures 412. A cooling element 440 may remove heat from a substrate 420. Thus, a coolest region 470 may be in contact with the substrate 420. In one embodiment, the heat may be delivered via the nanostructures 412 at the same time that heat is removed by the cooling element 440. For example, the heat delivered through the nanostructures 412 may increase the deformability of nearby resist, while the cooling element 440 increases structural stability of resist in gaps between the nanostructures 412. Alternatively or in addition, the cooling element 440 may cool the resist 430 below its glass-transition temperature after heat is no longer being delivered, so the mold 410 can be withdrawn.

Figure 5:
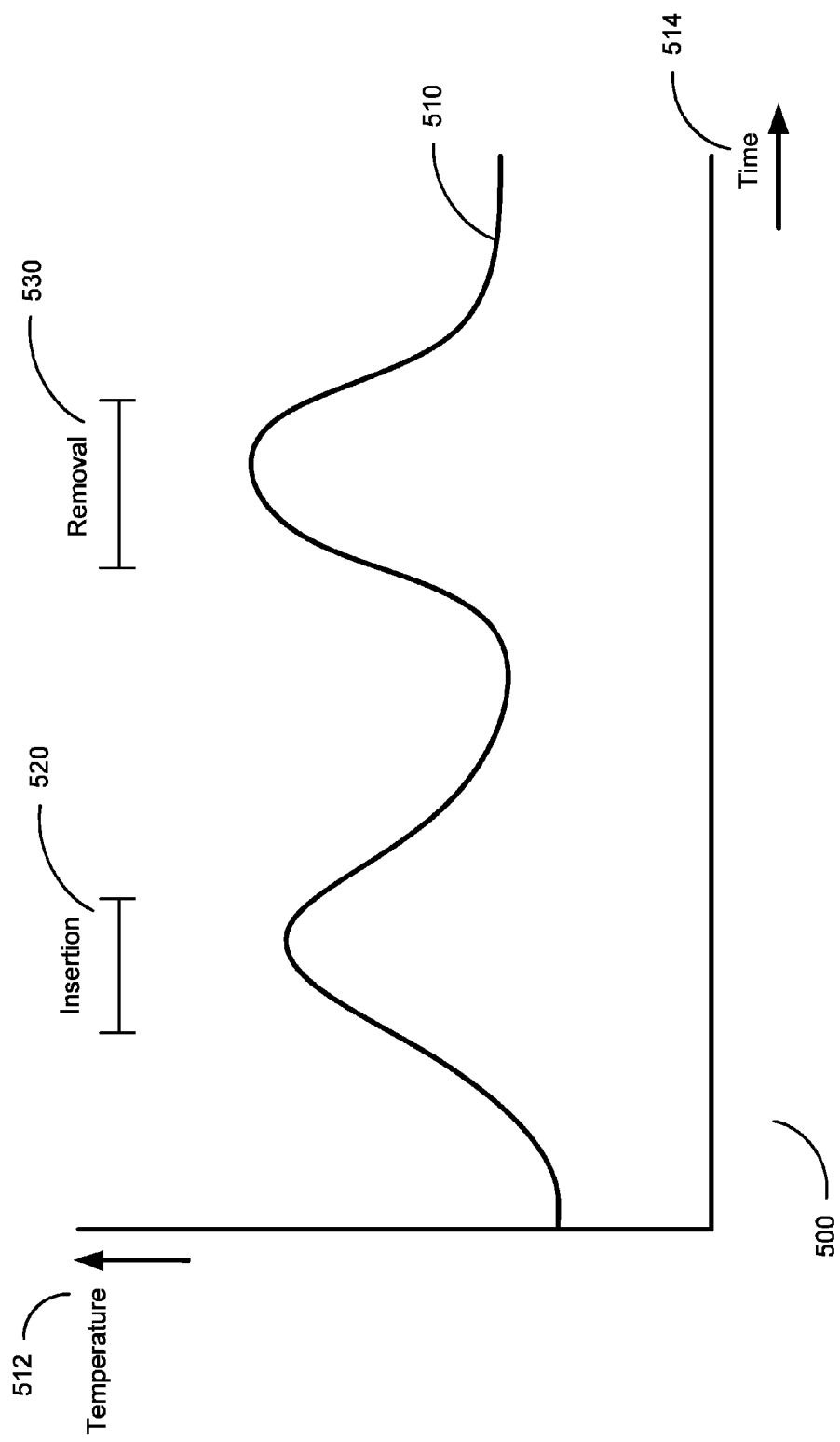
FIG. 5 is a graph of a temperature curve of the heating elements as a function of time.

FIG. 5 is a graph 500 of a temperature curve 510 of the heating elements 214 as a function of time. The graph 500 has a temperature axis 512 and a time axis 514. During an insertion time 520, the heating elements 214 may deliver a first predetermined amount of heat to the resist 230. For example, the heating elements 214 may activate for a predetermined pulse time, which may be longer than the insertion time 520. The first predetermined amount of heat may be selected to soften the resist 230 sufficiently for the mold 210 to imprint in the resist 230. After insertion, the heating elements 214 may cease delivering heat, and the resist 230 may be cooled and hardened by the cooling element 240. Once the resist 230 has hardened, the heating elements 214 may deliver a second predetermined amount of heat during a removal time 530. The second predetermined amount of heat may be selected to soften the resist 230 sufficiently for the mold 210 to be separated from the resist 230 without causing damage to the lithographic pattern. The second predetermined amount of heat may be selected not to soften the resist 230 so much as to dissolve the lithographic pattern.

Figure 6:
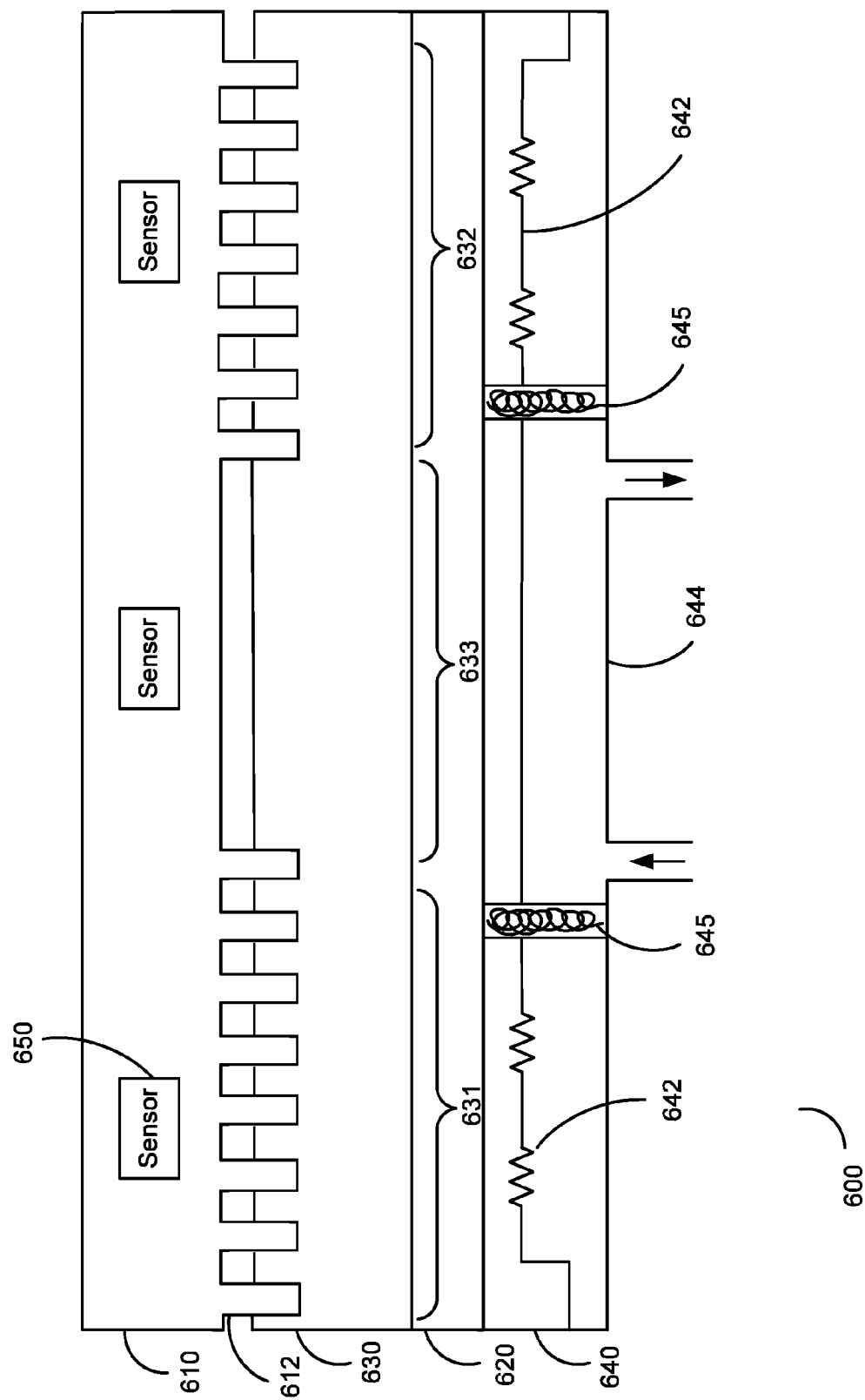
FIG. 6 is a cross-section view of a system for nanoimprinting a lithographic pattern into a resist.

FIG. 6 is a cross-section view of a system 600 for nanoimprinting a lithographic pattern into a resist 630. A mold 610 may include a plurality of nanostructures 612 configured to imprint in a first area 631 and a second area 632 of the resist 630 while not imprinting in third area 633. A heating and cooling mechanism 640 may be in contact with a substrate 620. The heating and cooling mechanism may include resistive heating elements 642 configured to deliver heat to the first and second areas 631, 632 and a cooling element 644 configured to remove heat from the third area 633. As a result, the first and second areas 631, 632 may be above the glass-transition temperature to allow for imprinting while the third area 633 may be below the glass-transition temperature to prevent undesirable deformation. The heating and cooling elements 642, 644 may be thermally insulated from each other by insulation 645. The mold 610 may include a plurality of sensors 650. The plurality of sensors 650 may be configured to indirectly measure temperatures of the first, second, and third areas 631, 632, 633. The heating and cooling mechanism 640 may be configured to adjust the amount of heat delivered and/or removed based on feedback from the sensors 650.

Figure 7:
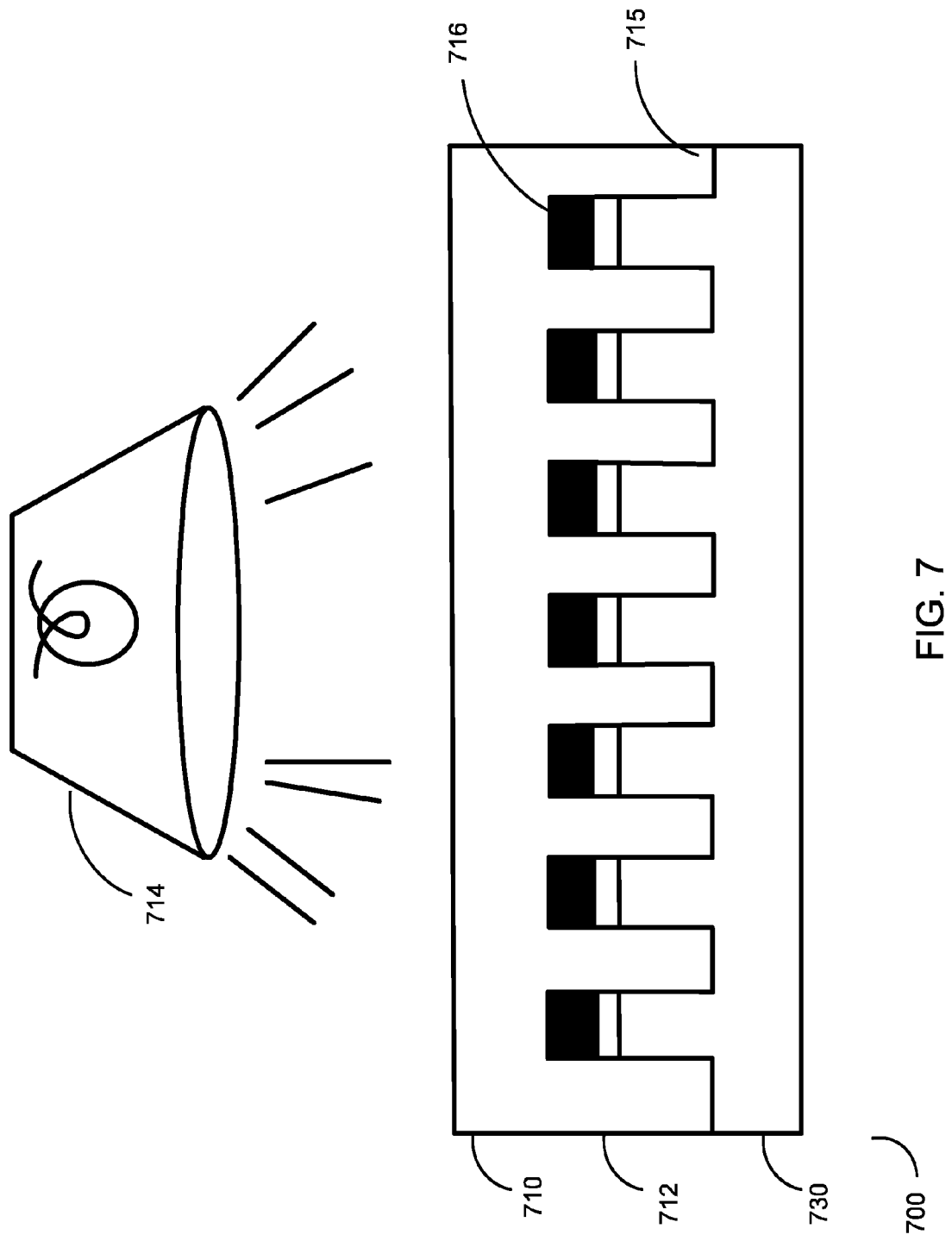
FIG. 7 is a schematic diagram of a system for nanoimprinting a lithographic pattern into a resist.

FIG. 7 is a schematic diagram of a system 700 for nanoimprinting a lithographic pattern into a resist 730. The system 700 may include a photoirradiation unit 714 configured to heat the resist 730 by delivering electromagnetic radiation, such as UV light, x-rays, and/or the like, to the resist 730. Alternatively or in addition, the resist 730 may be a UV curable liquid. A mold 710 imprinting into the resist 730 may include first regions 715 with a first transparency and second regions 716 with a second transparency. The first and second regions 715, 716 may thus allow different amounts of heat to be delivered to different sections of the resist 730. In the illustrated embodiment, the first region 715 may include a plurality of nanostructures 712 and may be configured to allow through most or all of the radiation. The second region 716 may include the gaps between the nanostructures 712 and may be configured to block most or all of the radiation. Thus, resist near the nanostructures 712 may be above the glass-transition temperature and easily deformable while resist near the gaps may be below the glass-transition temperature and not easily deformable. In other embodiments, such as when the resist 730 is UV curable, the first region 715 may block most or all radiation while the second region 716 allows through most or all radiation. In other embodiments, the system may contain multiple, independently operable photoirradiation units. In some embodiments, local photoirradiation units (e.g., LEDs, quantum dots, plasmonic resonators, or the like) may be incorporated into the nanostructures.

Figure 8:
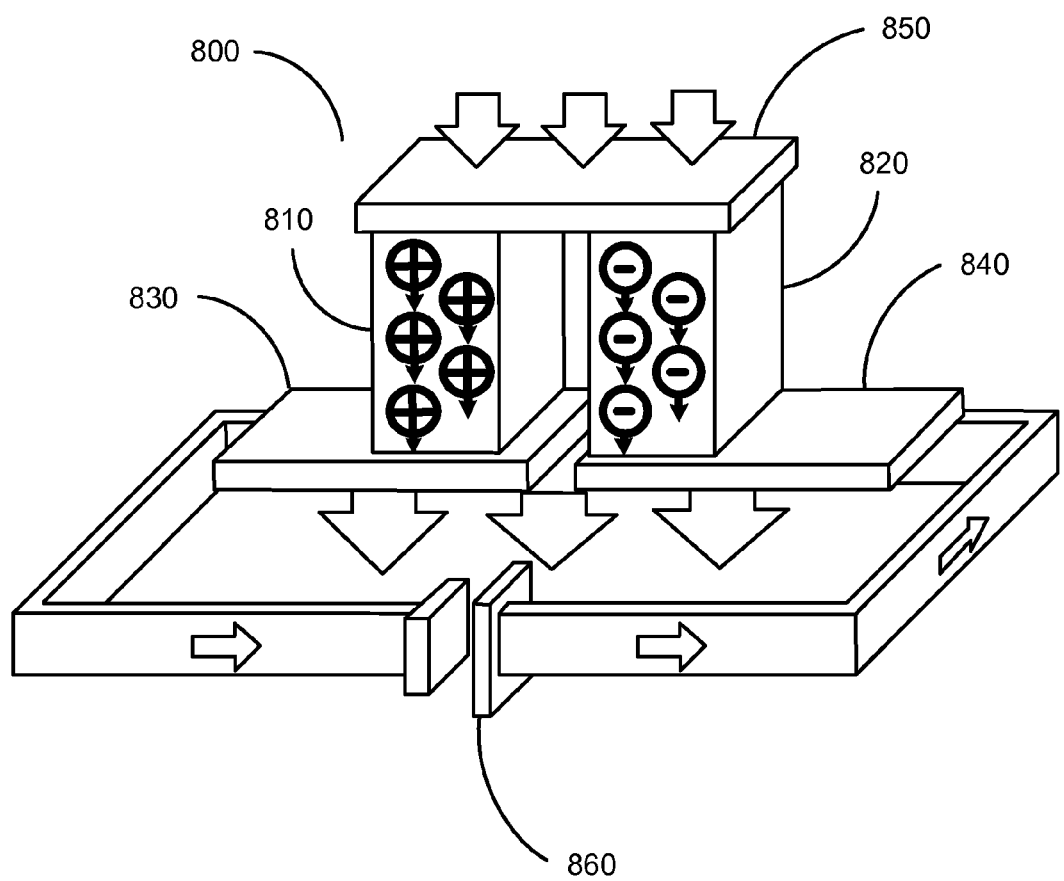
FIG. 8 is a perspective view of a thermoelectric element configured to deliver and/or remove heat from a material.

FIG. 8 is a perspective view of a thermoelectric element 800 configured to deliver and/or remove heat from a material (not shown). The thermoelectric element 800 may include one or more doped semiconductors. A first semiconductor 810 may include p-type doping (i.e., may include excess electron holes), and a second semiconductor 820 may include n-type doping (i.e., may include excess electrons). A first conductor 830 may be directly coupled to the first semiconductor 810, a second conductor 840 may be directly coupled to the second semiconductor 820, and a third conductor 850 may be directly coupled to the first and second semiconductors 810, 820. The first and second conductors 830, 840 may be directly coupled and/or wired to a power supply 860.

Figure 9:
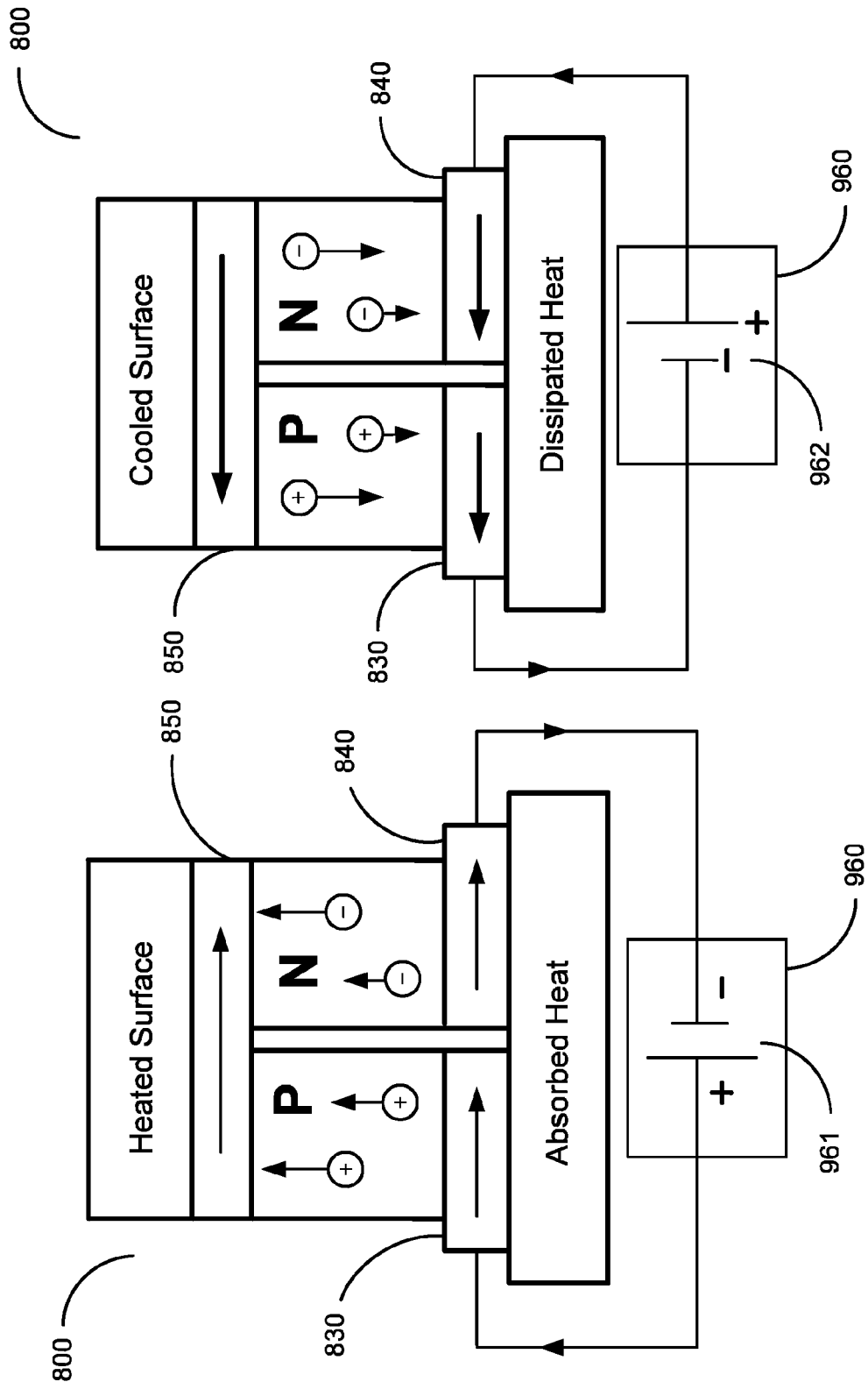
FIG. 9A is a schematic diagram of the operation of the thermoelectric element when coupled to a selectively operable power supply.
FIG. 9B is a schematic diagram of the operation of the thermoelectric element when coupled to a selectively operable power supply.

FIGS. 9A,B are schematic diagrams of the operation of the thermoelectric element 800 when coupled to a selectively operable power supply 960. The selectively operable power supply 960 may apply a voltage with a first polarity 961 to pump heat to the third conductor 850 from the first and second conductors 830, 840 and apply a voltage with a second polarity 962 to pump heat from the third conductor 850 to the first and second conductors 830, 840. Thus, the third conductor 850 and/or the first and second conductors 830, 840 may be able to remove and deliver heat to a material based on the polarity applied by the selectively operable power supply 960.

Figure 10:
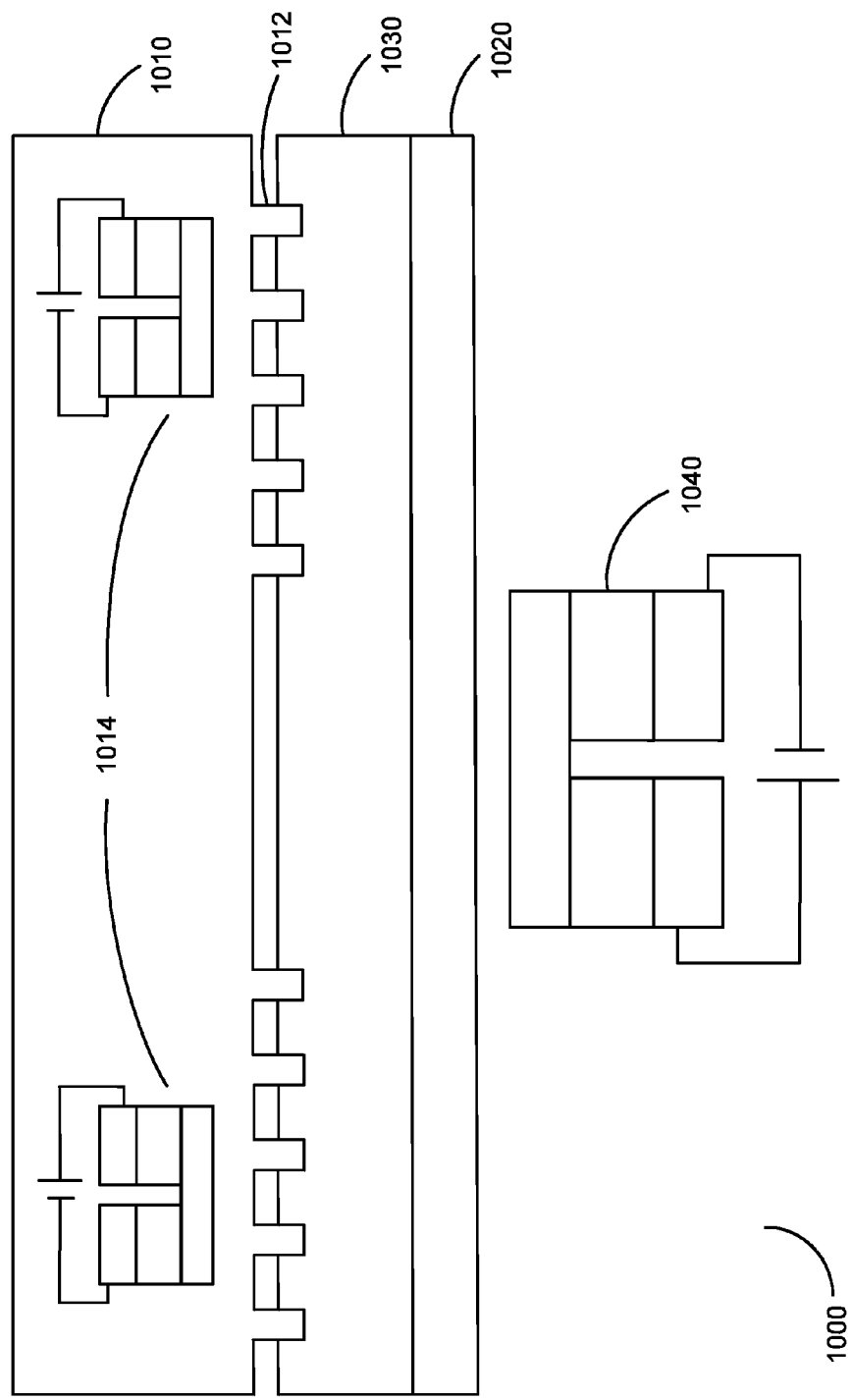
FIG. 10 is a cross-section view of a system for nanoimprinting a lithographic pattern into a resist.

FIG. 10 is a cross-section view of a system 1000 for nanoimprinting a lithographic pattern into a resist 1030. A mold 1010 may include a plurality of nanostructures 1012 and mold thermoelectric elements 1014 configured to alter a temperature of the mold 1010 and/or nanostructures 1012. The resist 1030 may be atop a substrate 1020, and a substrate thermoelectric element 1040 may be configured to alter a temperature of the substrate 1020. The thermoelectric elements 1014, 1040 may be configured to deliver heat and/or remove heat from the mold 1010 and substrate 1020. When the resist 1030 is in thermal contact with the mold 1010 and/or substrate 1020, a temperature of the resist 1030 may be modified by the thermoelectric elements 1014, 1040 as well.

Figure 11:
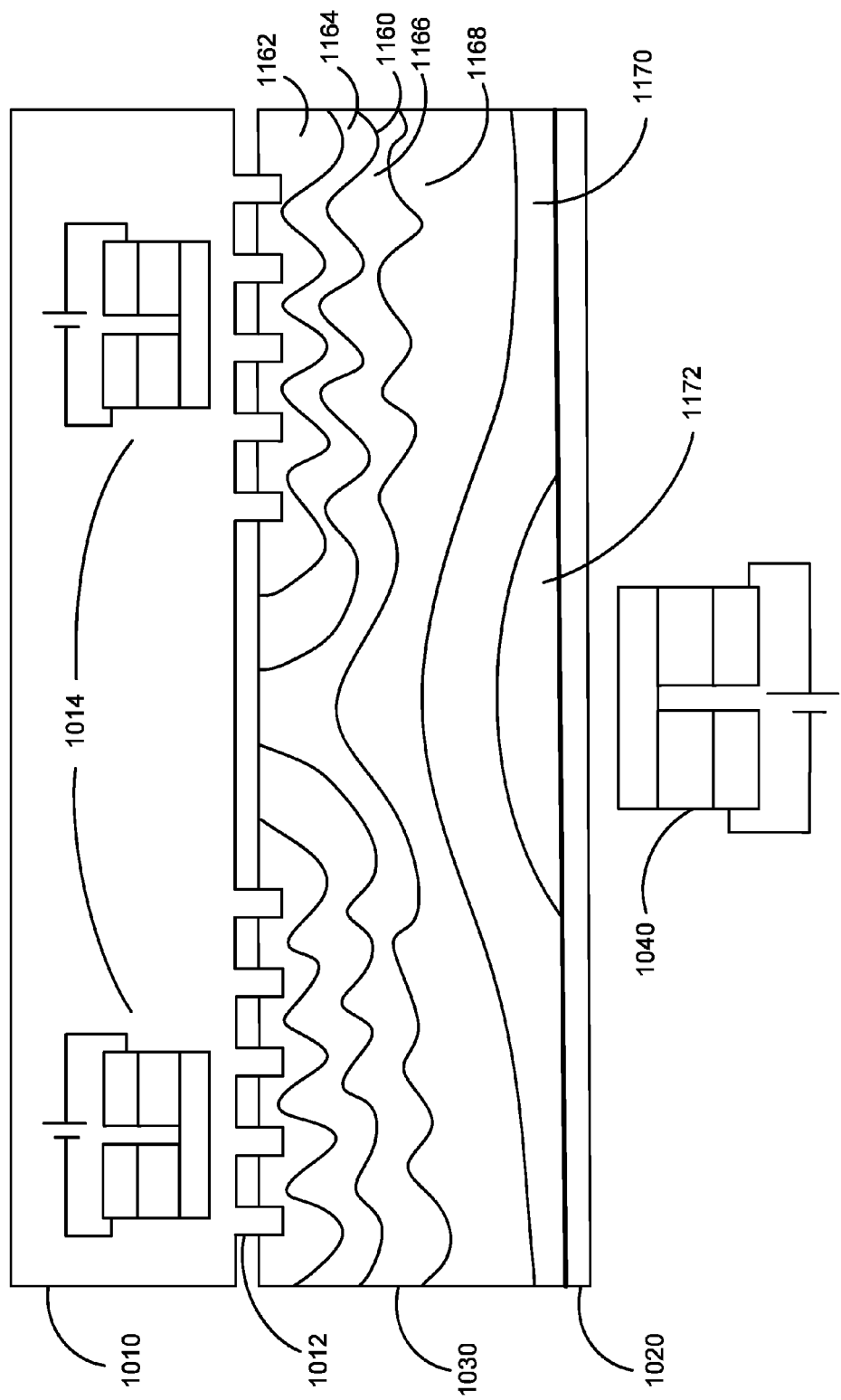
FIG. 11 is a cross-section view of the system and a spatial temperature profile created in the resist by that system.

FIG. 11 is a cross-section view of the system 1000 and a spatial temperature profile 1160 created in the resist 1030 by that system 1000. The mold thermoelectric elements 1014 may be configured to deliver heat to the resist 1030 while the substrate thermoelectric element 1040 removes heat from the resist 1030. The mold thermoelectric elements 1014 may be positioned near the nanostructures 1012 while the substrate thermoelectric element 1040 may be positioned near an area of the resist 1030 where the nanostructures 1012 are not imprinted. Under such a configuration, the mold thermoelectric elements 1014 may heat a section of the resist 1030 so that it may be deformed by the nanostructures 1012 while the substrate thermoelectric element 1040 cools and maintains the structural stability of the area of the resist 1030 where the nanostructures 1012 are not imprinted. A plurality of regions 1162, 1164, 1166, 1168, 1170, 1172, each at a same temperature, may result with the hottest region 1162 nearest the mold thermoelectric elements 1014 and the coldest region 1172 nearest the substrate thermoelectric element 1040. Alternatively or in addition, one or more of the thermoelectric elements 1014, 1040 may deliver heat to the resist 1030 during a first time period and remove heat from the resist 1030 during a second time period.

Figure 12B:
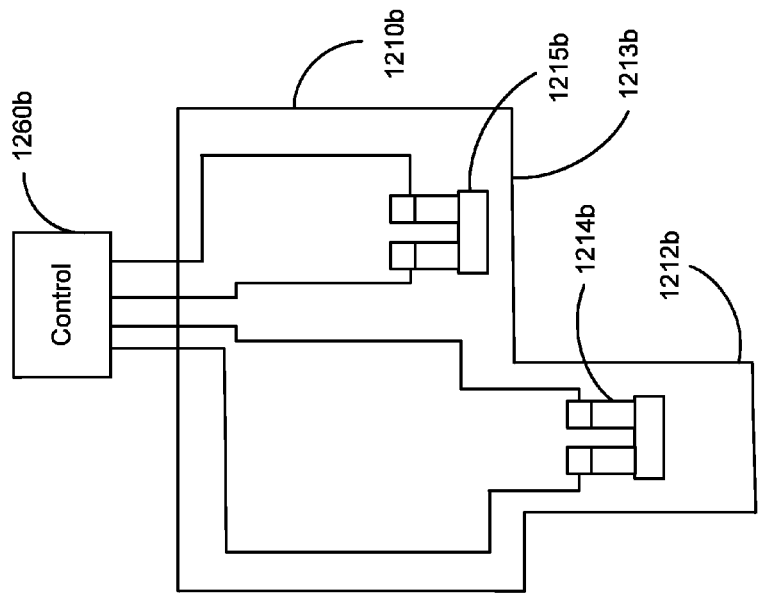
FIG. 12B is a cross-section view of arrangements of thermoelectric elements within molds.
Figure 12A:
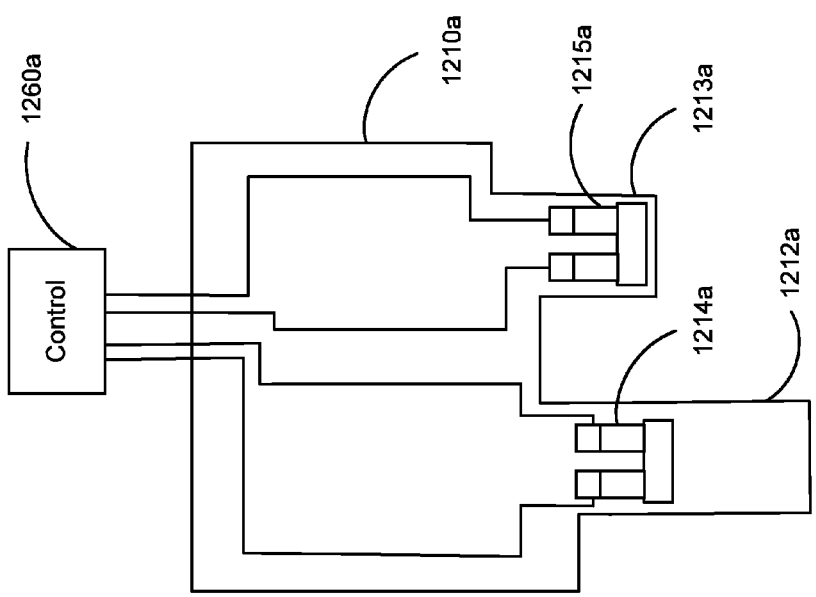
FIG. 12A is a cross-section view of arrangements of thermoelectric elements within molds.

FIGS. 12A,B are cross-section views of arrangements of thermoelectric elements 1214*a,b*, 1215*a,b* within molds 1210*a,b*. A first mold 1210*a* may include nanostructures 1212*a*, 1213*a* with different heights. Accordingly, a first thermoelectric element 1214*a* may alter the temperature of a longer nanostructure 1212*a*, and a second thermoelectric element 1215*a* may alter the temperature of a shorter nanostructure 1213*a*. A control unit 1260*a* may be configured to selectively alter the temperature of the thermoelectric elements 1214*a*, 1215*a* by determining a magnitude and polarity of a voltage delivered to each thermoelectric element 1214*a*, 1215*b*. Similarly, a second mold 1210*b* may include a nanostructure 1212*b* and a gap 1213*b* without a nanostructure. A first thermoelectric element 1214*b* may alter the temperature of the nanostructure 1212*b*, and a second thermoelectric element 1215*b* may alter the temperature of the gap 1213*b*. A control unit 1260*b* may be configured to select a polarity and magnitude of a voltage delivered to each thermoelectric element 1214*b*, 1215*b*.

FIGS. 13A,B are graphs 1300*a,b* of temperature curves 1310*a,b*, 1311*a,b* for the thermoelectric elements 1214*a,b*, 1215*a,b*. The graphs 1300*a,b* include temperature 1312*a,b* and time 1314*a,b* axes. Temperature curve 1310*a* may be a temperature curve for the first thermoelectric element 1214*a* during imprinting of the mold 1210*a*, and temperature curve 1311*a* may be a temperature curve for the second thermoelectric element 1215*a*. Prior to an insertion time 1320*a*, the temperature of the first thermoelectric element 1214*a* may begin increasing rapidly and significantly. The temperature of the second thermoelectric element 1215*a* may not begin increasing until after insertion and may increase less rapidly and less significantly. At the end of the insertion time 1320*a*, the temperature of the thermoelectric elements 1214*a*, 1215*a* may decrease until the thermoelectric elements 1214*a*, 1215*a* are removing heat from the nanostructures 1212*a*, 1213*a*. During a removal time 1330*a*, the thermoelectric elements 1214*a*, 1215*a* may remain at the cooler temperature.

Temperature curve 1310*b* may be a temperature curve for the first thermoelectric element 1214*b* during imprinting of the mold 1210*b*, and temperature curve 1311*b* may be a temperature curve for the second thermoelectric element 1215*b*. Prior to an insertion time 1320*b*, the first thermoelectric element 1214*b* may begin heating the nanostructure 1212*b*, and the second thermoelectric element 1215*b* may begin cooling the gap 1213*b*. At the end of the insertion time 1320*b*, the first thermoelectric element 1214*b* may begin cooling the nanostructure 1212*b*, and the second thermoelectric element 1215*b* may be allowed to return to thermal equilibrium. During a removal time 1330*b*, the first thermoelectric element 1214*b* may continue to cool the nanostructure 1212*b*, and the second thermoelectric element 1215*b* may continue to return to thermal equilibrium.

It will be understood by those having skill in the art that many changes may be made to the details of the above-described embodiments without departing from the underlying principles of the disclosure. The scope of the present disclosure should, therefore, be determined only by the following claims.

The invention claimed is:

1. A system for nanoimprinting a lithographic pattern into a material, the system comprising:
   a mold comprising a plurality of protruding nanostructures, wherein the plurality of protruding nanostructures are configured to form the lithographic pattern when imprinted into the material; and
   a first thermal element configured to alter a temperature of a first section of the material smaller than the whole material for a predetermined pulse time, wherein the first thermal element comprises a thermoelectric element for delivering and/or removing heat based on the polarity of a voltage that is applied to the thermoelectric element;
   wherein the predetermined pulse time is selected to be less than an equilibrium time for the material to reach thermal equilibrium;
   wherein the first thermal element is disposed within a protruding nanostructure of the plurality of protruding nanostructures; and
   wherein the plurality of protruding nanostructures are configured to separate from the material after the lithographic pattern has been formed.

2. The system of claim 1, wherein a spatial temperature profile of the first section is based on the predetermined pulse time.

3. The system of claim 1, wherein a spatial profile of material at a same temperature value is based on the predetermined pulse time.

4. The system of claim 1, further comprising a sensor configured to acquire time dependent measurements of a property of the material.

5. The system of claim 4, wherein the first thermal element is configured to select the predetermined pulse time based on the time dependent measurements.

6. The system of claim 1, wherein at least one of the plurality of protruding nanostructures is configured to conduct thermal energy between the first thermal element and the first section of the material.

7. A system for nanoimprinting a lithographic pattern into a mask on a substrate, the system comprising:
   a mold comprising a plurality of protruding nanostructures, wherein the plurality of protruding nanostructures are configured to form the lithographic pattern when imprinted into the mask; and
   a thermal element configured to alter a temperature of the mask, wherein the first thermal element comprises a thermoelectric element for delivering and/or removing heat based on the polarity of a voltage that is applied to the thermoelectric element;
   wherein the mask comprises a first substance with a first thermal diffusivity and a second substance with a second thermal diffusivity;
   wherein the thermal element is disposed within a protruding nanostructure of the plurality of protruding nanostructures; and
   wherein the plurality of protruding nanostructures and the mask are configured to separate from one another after the lithographic pattern has been formed.

8. The system of claim 7, wherein the thermal element is configured to alter a temperature of a first section of the mask smaller than the whole mask for a predetermined pulse time, and
   wherein the predetermined pulse time is selected to be less than an equilibrium time for the mask to reach thermal equilibrium.

9. The system of claim 8, wherein a spatial temperature profile of the first section is based on the predetermined pulse time.

10. The system of claim 8, further comprising a sensor configured to acquire time-dependent measurements of a property of the mask.

11. The system of claim 10, wherein the thermal element is configured to select the predetermined pulse time based on the time dependent measurements.

12. The system of claim 8, wherein at least one of the plurality of protruding nanostructures is configured to conduct thermal energy between the thermal element and the first section of the material.

13. A system for nanoimprinting a lithographic pattern into a material, the system comprising:
   a mold comprising a plurality of protruding nanostructures, wherein the plurality of protruding nanostructures are configured to form the lithographic pattern when imprinted into the material; and
   a first thermal element configured to alter a temperature of a first section of the material smaller than the whole material for a predetermined pulse time, wherein the first thermal element comprises a thermoelectric element for delivering and/or removing heat based on the polarity of a voltage that is applied to the thermoelectric element;
   wherein the predetermined pulse time is selected to be less than an equilibrium time for the material to reach thermal equilibrium;
   wherein the first thermal element is disposed within a protruding nanostructure of the plurality of protruding nanostructures.

14. The system of claim 13, further comprising a sensor configured to acquire time dependent measurements of a property of the material.

15. The system of claim 14, wherein the first thermal element is configured to select the predetermined pulse time based on the time dependent measurements.

16. The system of claim 13, wherein at least one of the plurality of protruding nanostructures is configured to conduct thermal energy between the first thermal element and the first section of the material.

17. The system of claim 1, wherein a material depth of the first section substantially equals an imprint depth of the mold.

18. The system of claim 1, wherein at least one protruding nanostructure of the plurality of protruding nanostructures is configured to imprint in the first section.

19. The system of claim 1, wherein at least one protruding nanostructure of the plurality of protruding nanostructures is configured to imprint within a predetermined distance of the first section.

20. The system of claim 1, wherein the predetermined pulse time is less than an imprint time.

21. The system of claim 1, wherein the predetermined pulse time is selected based on a thermal diffusivity of the material.

22. The system of claim 4, wherein the sensor is configured to measure the temperature of the material.

23. The system of claim 4, wherein the sensor is configured to monitor an optical property of the material.

24. The system of claim 4, wherein the sensor is configured to monitor an electrical property of the material.

25. The system of claim 1, wherein the first thermal element is configured to alter the temperature of the first section a plurality of times for a corresponding plurality of predetermined pulse times.

26. The system of claim 1, wherein the first thermal element is configured to deliver a sequence of thermal pulses, wherein each thermal pulse delivers heat to or removes heat from the first section, and wherein each thermal pulse lasts for a corresponding predetermined pulse time.

27. The system of claim 26, wherein the first thermal element is configured to:
 deliver heat for a predetermined heating time; and
 remove heat for a predetermined cooling time.

28. The system of claim 27, wherein the first thermal element is configured to remove heat from the first section during separation of the mold from the material.

29. The system of claim 1, wherein the predetermined pulse time is selected to create a predetermined spatial temperature profile in the material.

30. The system of claim 1, wherein the predetermined pulse time is selected to create a predetermined spatial temperature profile in the mold.

31. The system of claim 1, wherein the predetermined pulse time is selected to create a predetermined spatial profile of material at an operative temperature.

32. The system of claim 1, wherein the first thermal element is configured to deliver a predetermined amount of heat to the first section.

33. The system of claim 1, wherein the first thermal element is configured to remove a predetermined amount of heat from the first section.

34. The system of claim 1, further comprising a second thermal element configured to alter a temperature of a second section of the material smaller than the whole material.

35. The system of claim 34, wherein the first and second thermal elements are configured to create a predetermined spatial temperature profile in the material.

36. The system of claim 34, wherein the first and second thermal elements are configured to create a predetermined spatial temperature profile in the mold.

37. The system of claim 34, wherein the first thermal element is configured to deliver heat to the first section, and wherein the second thermal element is configured to remove heat from the second section.

38. The system of claim 34, wherein the first thermal element is configured to deliver a first predetermined amount of heat to the first section, and wherein the second thermal element is configured to deliver a second predetermined amount of heat to the second section.

* * * * *